(12) United States Patent
Geissler

(10) Patent No.: US 6,888,402 B2
(45) Date of Patent: May 3, 2005

(54) LOW VOLTAGE CURRENT REFERENCE CIRCUITS

(75) Inventor: Stephen F. Geissler, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/604,910

(22) Filed: Aug. 26, 2003

(65) Prior Publication Data

US 2005/0046469 A1 Mar. 3, 2005

(51) Int. Cl.[7] .................................................. G05F 3/26
(52) U.S. Cl. ........................ 327/543; 327/541; 323/315
(58) Field of Search ................................. 327/434, 437, 327/539, 541, 543; 323/313, 315

(56) References Cited

U.S. PATENT DOCUMENTS

| | | | | |
|---|---|---|---|---|
| 5,017,811 A | | 5/1991 | Worley | 326/71 |
| 5,180,967 A | * | 1/1993 | Yamazaki | 323/315 |
| 5,955,874 A | * | 9/1999 | Zhou et al. | 323/315 |
| 6,204,724 B1 | * | 3/2001 | Kobatake | 327/541 |
| 6,285,247 B1 | | 9/2001 | Shoji | 327/544 |
| 6,300,819 B1 | | 10/2001 | De et al. | 327/534 |
| 2003/0109142 A1 | * | 6/2003 | Cable et al. | 438/708 |

* cited by examiner

Primary Examiner—Timothy P. Callahan
Assistant Examiner—Terry L. Englund
(74) Attorney, Agent, or Firm—Richard A. Henkler; Dugan & Dugan

(57) ABSTRACT

A current reference circuit, for generating a reference current from a low voltage supply source, includes a first n-channel field effect transistor (NFET) having a gate and a drain that are coupled together, and a grounded body; and a second NFET having a floating body, and a gate coupled to the gate of the first NFET.

9 Claims, 3 Drawing Sheets

LOW VOLTAGE CURRENT REFERENCE CIRCUITS

BACKGROUND OF INVENTION

1. Field of the Invention

The present invention relates generally to current reference circuits, and more particularly to current reference circuits that operate at low voltages.

2. Background of the Invention

As complementary metal-oxide-semiconductor (CMOS) technology evolves to lower supply voltages, reference circuits, such as current sources, are required to operate at the lower supply voltages. However, conventional reference circuits (e.g., bandgap generators) typically have poor characteristics or fail to operate at low supply voltages. For example, a conventional bandgap generator having four levels of stacking (e.g., four components between a supply rail and ground), exhibits poor performance when a power supply voltage of about 1.5 volts or lower is employed.

FIG. 1 is a schematic diagram of a first conventional current reference circuit 100 that employs four levels of stacking. With reference to FIG. 1, the reference circuit 100 includes a first p-channel metal-oxide-semiconductor field effect transistor (PFET) 102, a second PFET 104, a first n-channel metal-oxide-semiconductor field effect transistor (NFET) 106, a second NFET 108, a resistor 110, a first diode 112 and a second diode 114. A source of the first PFET 102 and a source of the second PFET 104 are coupled to a rail voltage ($V_{DD}$). A drain of the first PFET 102 and a drain of the first NFET 106 are coupled together and to a gate of the first NFET 106 and to a gate of the second NFET 108. A drain of the second PFET 104 and a drain of the second NFET 108 are coupled together and to a gate of the first PFET 102 and to a gate of the second PFET 104. A source of the first NFET 106 is coupled to ground via the first diode 112, and a source of the second NFET 108 is coupled to ground via the resistor 110 and the second diode 114. The first and second diodes 112, 114 are selected so as to have areas that differ by a factor of n.

As is known in the art, the feedback loop formed by the PFETs 102, 104 and the second NFETs 106, 108 forces the first diode 112 and the second diode 114 to operate at the same bias current. Accordingly, the reference circuit 100 may serve as a constant current source having an output current (e.g., through the second NFET 108) related to the ratio of the areas of the first and second diodes 112, 114 (e.g., an output current related to a natural log of the factor n). While suitable for supply voltages in excess of about 1.5 volts, the four levels of stacking of the reference circuit 100 are not suitable for use at lower voltages (e.g., as a voltage lower than about 1.5 volts is insufficient to properly bias the transistors and diodes of the reference circuit 100).

FIG. 2 is a schematic diagram of a second conventional current reference circuit 200 that employs three levels of stacking. The second current reference circuit 200 is similar to the first current reference circuit 100 of FIG. 1, but does not employ the first and second diodes 112, 114. In the reference circuit 200 of FIG. 2, the feedback loop formed by the PFETs 102, 104 and the NFETs 106, 108 forces the current through the first and second NFETs 106, 108 to be equal and proportional to the difference between the threshold voltages ($V_{TH}$) of the first NFET 106 and the second NFET 108 (e.g., $I_{OUT}=(V_{THN1}-V_{THN2})/R$). While suitable for use with low supply voltages (e.g., due to only three levels of stacking), the current reference circuit 200 requires the use of transistors having multiple threshold voltages (e.g., requiring multiple and precise implant doses during device manufacture, and increasing manufacturing time and cost).

FIG. 3 is a schematic diagram of a third conventional current reference circuit 300 that also employs three levels of stacking. The third current reference circuit 300 is similar to the second current reference circuit 200 of FIG. 2, but employs NFETs implemented using p-well technology (e.g., the first and the second NFETs 106, 108 employ body contacts). The same channel length is employed for each of the first and second NFETs 106, 108, but differing channel widths are used (e.g., creating a resistance differential between the first and second NFETs 106, 108 that behaves similarly to the resistor 110 of the first conventional reference circuit 100 of FIG. 1). The body contacts of both the first and the second NFETs 106, 108 are grounded. Additionally, a resistor 116 is coupled between the source of the first NFET 106 and ground.

In the reference circuit 300 of FIG. 3, the feedback loop formed by the PFETs 102, 104 and the NFETs 106, 108 forces the current through the first and second NFETs 106, 108 to be equal and proportional to the difference between the threshold voltages ($V_{TH}$) of the first NFET 106 and the second NFET 108 (e.g., $I_{OUT}=(V_{THN1}-V_{THN2})/R$. The voltage drop across the resistor 116 produces an equivalent voltage drop across the body-source regions of the first NFET 106 so as to increase the threshold voltage of the first NFET 106. While suitable for use at low supply voltages (e.g., due to only three levels of stacking), the current reference circuit 300 requires the use of p-well technology (increasing manufacturing time and cost).

Accordingly, a need exists for improved methods and apparatus for generating a current reference when low supply voltages are employed.

SUMMARY OF INVENTION

In a first aspect of the invention, a first current reference circuit is provided that includes (1) a first n-channel field effect transistor (NFET) having a gate and a drain that are coupled together; and (2) a second NFET having a floating body.

In a second aspect of the invention, a second current reference circuit is provided that includes (1) a first n-channel field effect transistor (NFET) having a gate and a drain that are coupled together; and (2) a second NFET having a floating body. In the second current reference circuit, the first and second NFETs are configured so as to generate a reference current at a supply voltage of not more than about 0.5 volts. Numerous other aspects are provided, as are methods in accordance with these and other aspects of the invention.

Other features and aspects of the present invention will become more fully apparent from the following detailed description, the appended claims and the accompanying drawings.

DETAILED DESCRIPTION

Figure 3:
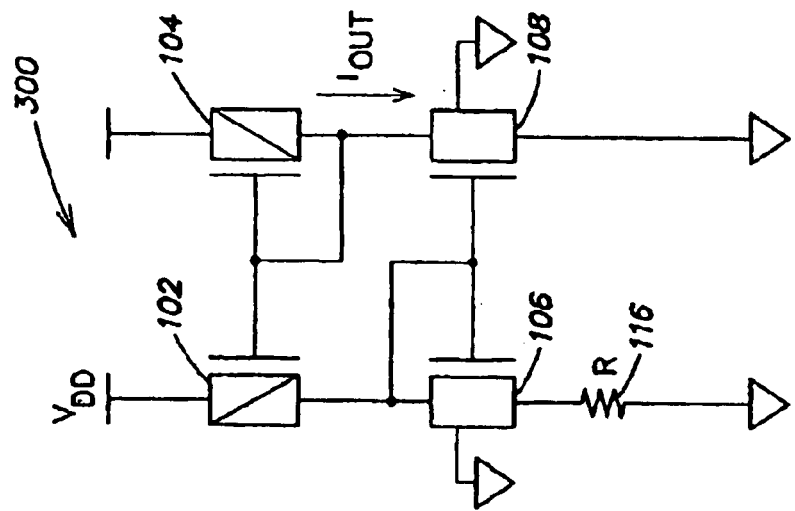
FIG. 3 is a schematic diagram of a third conventional current reference circuit that also employs three levels of stacking.
Figure 2:
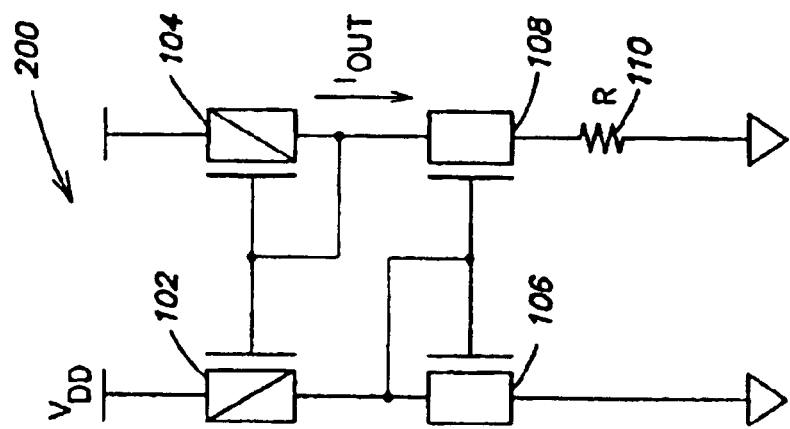
FIG. 2 is a schematic diagram of a second conventional current reference circuit that employs three levels of stacking.
Figure 1:
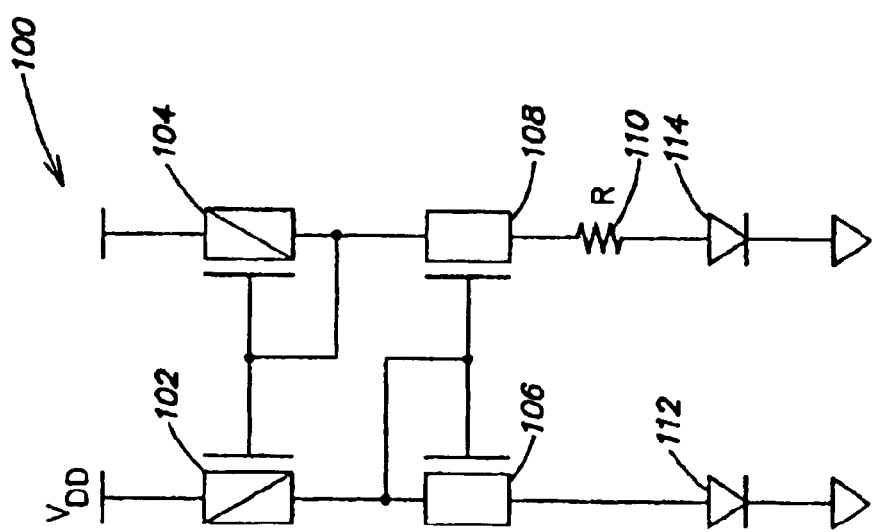
FIG. 1 is a schematic diagram of a first conventional current reference circuit that employs four levels of stacking.
Figure 4:
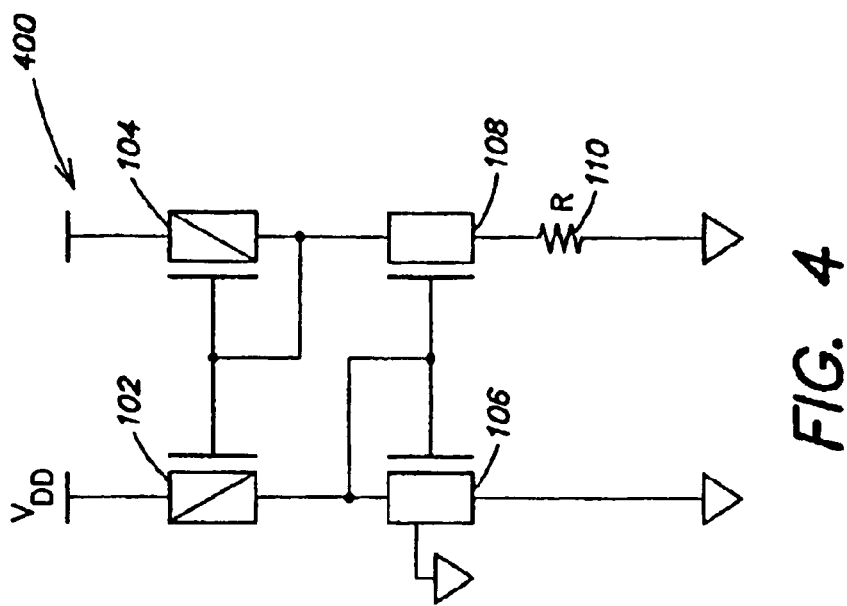
FIG. 4 is a schematic diagram of a first current reference circuit provided in accordance with the present invention.

FIG. 4 is a schematic diagram of a first current reference circuit 400 provided in accordance with the present invention. The inventive current reference circuit 400 is similar to the second current reference circuit 200 of FIG. 2, but employs silicon-on-insulator NFETs for the first and second NFETs 106, 108. Specifically, a body of the first NFET 106 is grounded and a body of the second NFET 108 is left floating (as shown).

The feedback loop formed by the PFETs 102, 104 and the second NFETs 106, 108 forces the current through the first and second NFETs 106, 108 to be equal and proportional to the difference between the threshold voltages ($V_{TH}$) of the first NFET 106 and the second NFET 108 (e.g., $I_{OUT}=(V_{THN1}-V_{THN2})/R$). However, with the body contact of the second NFET 108 left floating, the threshold voltage of the second NFET 108 results from the floating-body behavior of the second NFET 108 as described below with reference to FIG. 5.

Figure 5:
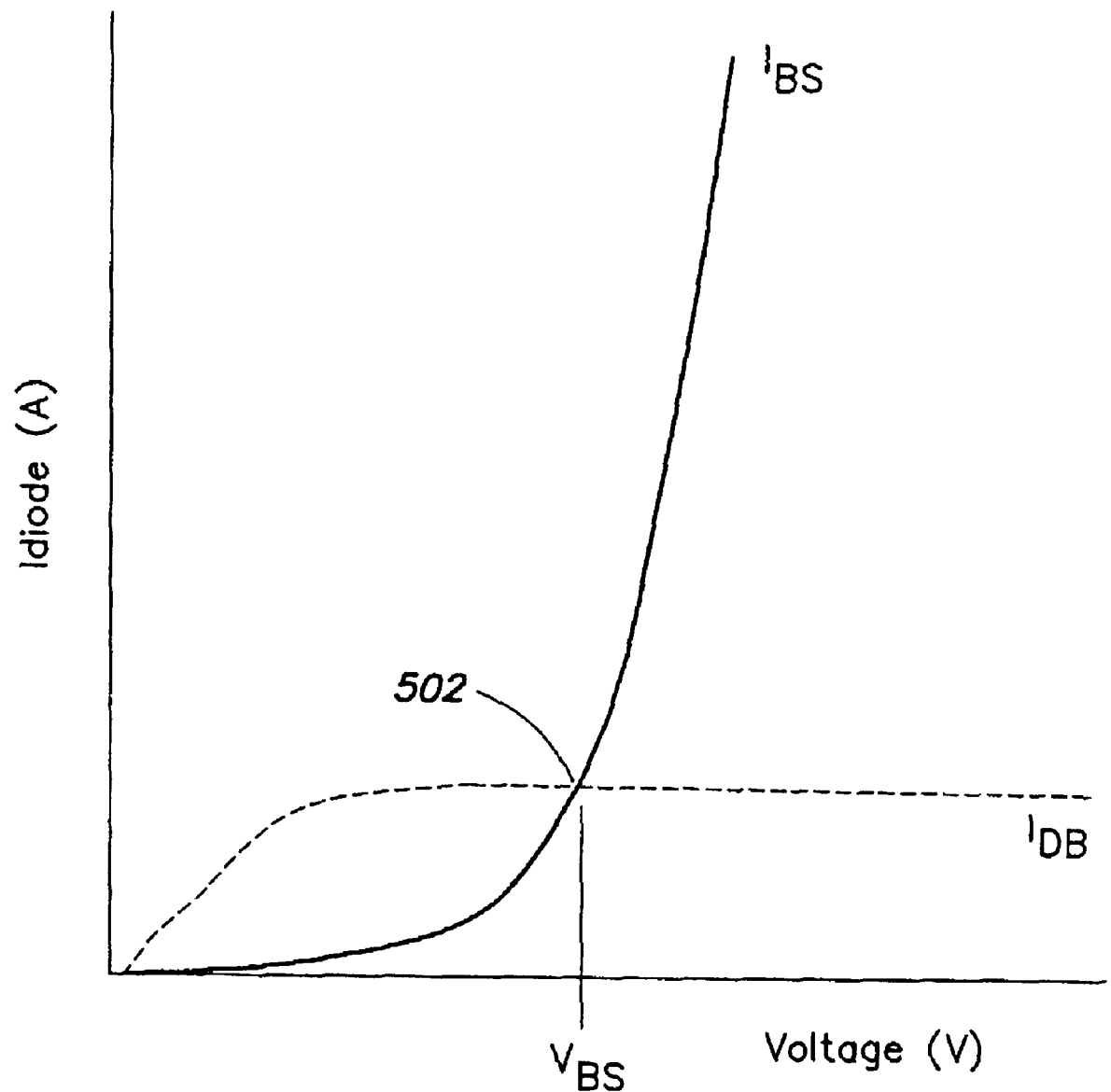
FIG. 5 is a graph of body-source current ($I_{BS}$) and drain-body current ($I_{DB}$) versus voltage for an NFET of the current reference circuit of FIG. 4 during operation of the current reference circuit.

FIG. 5 is a graph of body-source current ($I_{BS}$) and drain-body current ($I_{DB}$) for the second NFET 108 during operation of the current reference circuit 400. As shown in FIG. 5, the drain-body junction of the second NFET 108 is reversed biased (resulting in a relatively constant reverse leakage current $I_{DB}$), while the body-source junction of the second NFET 108 is forward biased (resulting in a forward diode current $I_{BS}$). The body-source voltage ($V_{BS}$) that determines the threshold voltage for the second NFET 108 is the equilibrium point at which the reverse junction current from drain-to-body ($I_{DB}$) equals the forward bias current from body-to-source ($I_{BS}$) as indicated by reference numeral 502 in FIG. 5. Because the body-source voltage is positive, the threshold voltage of the second NFET 108 is lowered. A reference current thereby may be generated as described above (e.g., through the second NFET 108).

The present inventor has found that the current reference circuit 400 provides an efficient current reference and high power supply rejection down to about 0.5 volts, and is employable with SOI CMOS technologies in which multiple threshold voltage devices are not offered. By employing identical channel implants for the NFETs 106, 108, a constant threshold voltage offset and improved threshold voltage tracking may be provided.

The foregoing description discloses only exemplary embodiments of the invention. Modifications of the above disclosed apparatus and method which fall within the scope of the invention will be readily apparent to those of ordinary skill in the art. For instance, while the present invention as been described primarily with reference to SOI devices, it will be understood that other transistors having body contacts also may be employed (e.g., p-well transistors).

Figure 6:
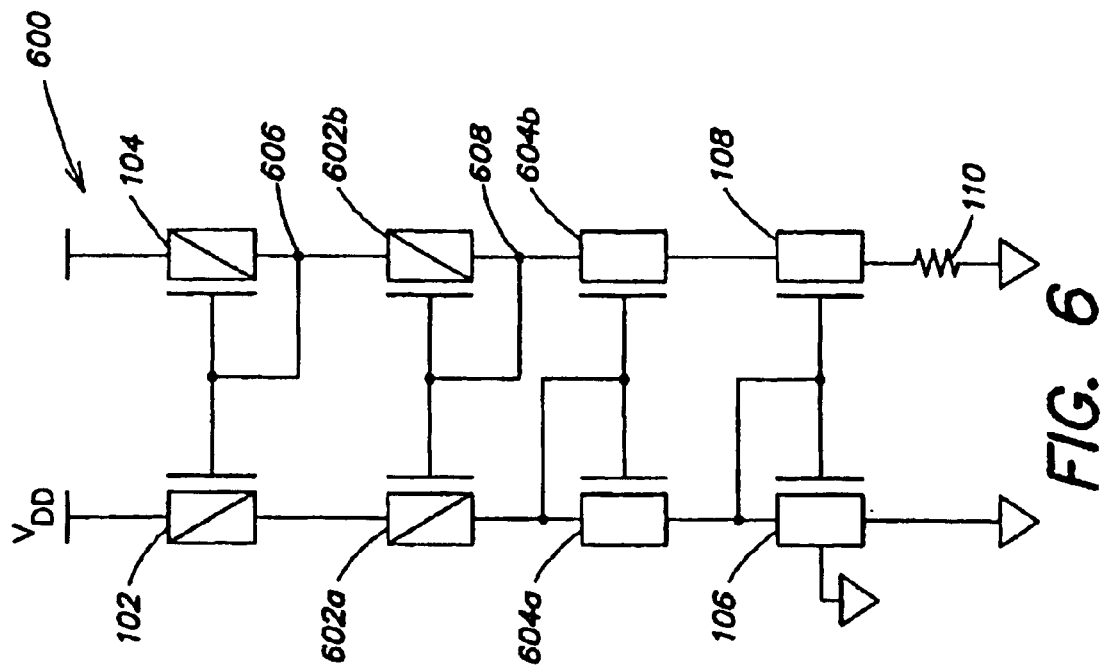
FIG. 6 is a schematic diagram of an alternative current reference circuit provided in accordance with the present invention.

While well suited for low voltage current reference circuits, the present invention also may be employed within current reference circuits that employ greater than 3 levels of stacking. For example, FIG. 6 is a second inventive current reference circuit 600 for providing multiple reference voltages. The second inventive current reference circuit 600 is similar to the first inventive current reference circuit 400 of FIG. 4, but employs an extra set of PFETs 602a, 602b and NFETs 604a, 604b coupled between the first and second PFETs 102, 104 and the first and second NFETs 106, 108 (as shown). As with the first inventive current reference circuit 400, silicon-on-insulator NFETs are employed for the first and second NFETs 106, 108. Specifically, a body of the first NFET 106 is grounded and a body of the second NFET 108 is left floating (as shown). Such higher stacking provides for multiple reference voltages (e.g., at a first node 606 and a second node 608 in FIG. 6); and higher supply voltages may be employed (e.g., about 3.3. volts or greater). Higher levels of stacking also may be employed.

Accordingly, while the present invention has been disclosed in connection with exemplary embodiments thereof, it should be understood that other embodiments may fall within the spirit and scope of the invention, as defined by the following claims.

What is claimed is:

1. A current reference circuit comprising:
   a first n-channel field effect transistor (NFET) having a gate and drain coupled together, and a body that is grounded; and
   a second NFET having a floating body and a gate coupled to the gate of the first NFET.

2. The current reference circuit of claim 1 wherein the first and second NFETs are silicon-on-insulator transistors.

3. The current reference circuit of claim 1 further comprising a resistive element and wherein:
   the first NFET includes a source that is grounded; and
   the second NFET includes a source that is coupled to ground via the resistive element.

4. The current reference circuit of claim 3 further comprising:
   a first p-channel field effect transistor (PFET) having:
      a gate;
      a drain coupled to the drain of the first NFET; and
      a source adapted to couple to a supply voltage; and
   a second PFET having:
      a gate coupled to the gate of the first PFET;
      a drain coupled to the gate of the second PFET and the drain of the second NFET; and
      a source adapted to couple to the supply voltage.

5. The current reference circuit of claim 3 wherein its supply voltage comprises a voltage of about 0.5 volts.

6. The current reference circuit of claim 3 further comprising:
   a third NFET having:
      a gate and a drain that are coupled together; and
      a source coupled to the drain of the first NFET; and
   a fourth NFET having:
      a gate coupled to the gate of the third NFET and
      a source coupled to the drain of the second NFET.

7. The current reference circuit of claim 6 wherein the fourth NFET includes a drain and further comprising:
   a first PFET having:
      a gate; and
      a drain coupled to the drain of the third NFET; and a second PFET having:
   a gate coupled to the gate of the first PFET; and
   a drain coupled to the gate of the second PFET and the drain of the fourth NFET.

8. The current reference circuit of claim 7 wherein the first PFET and the second PFET each include a source and further comprising:
   a third PFET having:
      a gate;
      a drain coupled to the source of the first PFET; and
      a source adapted to couple to a supply voltage; and
   a fourth PFET having:
      a gate coupled to the gate of the third PFET;
      a drain coupled to the gate of fourth PFET and the source of the second PFET; and
      a source adapted to couple to the supply voltage.

9. The current reference circuit of claim 8 wherein the supply voltage comprises a voltage of about 3.3 volts.

* * * * *